(12) United States Patent
Lin et al.

(10) Patent No.: US 10,326,459 B1
(45) Date of Patent: Jun. 18, 2019

(54) INJECTION LOCKED FREQUENCY DIVIDER

(71) Applicant: NATIONAL CHI NAN UNIVERSITY, Nantou (TW)

(72) Inventors: Yo-Sheng Lin, Nantou (TW); Shao-Siang Wang, Nantou (TW)

(73) Assignee: NATIONAL CHI NAN UNIVERSITY, Nantou (TW)

( * ) Notice: Subject to any disclaimer, the term of this patent is extended or adjusted under 35 U.S.C. 154(b) by 0 days.

(21) Appl. No.: 16/126,881

(22) Filed: Sep. 10, 2018

(30) Foreign Application Priority Data

May 2, 2018 (TW) .............................. 107114831 A

(51) Int. Cl.
| | | |
|---|---|---|
| H04L 25/40 | (2006.01) | |
| H03L 7/185 | (2006.01) | |
| H03L 7/193 | (2006.01) | |
| H03L 7/181 | (2006.01) | |
| H03H 11/32 | (2006.01) | |

(52) U.S. Cl.
CPC .............. *H03L 7/185* (2013.01); *H03L 7/181* (2013.01); *H03L 7/193* (2013.01); *H03H 11/32* (2013.01)

(58) Field of Classification Search
CPC ......... H03L 7/185; H03L 7/181; H03L 7/193; H03H 11/32
USPC .......................... 375/371, 373; 327/141, 162
See application file for complete search history.

(56) References Cited

U.S. PATENT DOCUMENTS

| | | | | |
|---|---|---|---|---|
| 9,088,272 | B1 * | 7/2015 | Horng ....................... | H03K 5/04 |
| 2008/0278204 | A1 * | 11/2008 | Jang ......................... | H03B 19/03 |
| | | | | 327/118 |
| 2009/0102565 | A1 * | 4/2009 | Jang ......................... | H03B 19/14 |
| | | | | 331/40 |
| 2012/0062287 | A1 * | 3/2012 | Jang ......................... | H03B 5/1228 |
| | | | | 327/156 |

* cited by examiner

*Primary Examiner* — Tesfaldet Bocure
(74) *Attorney, Agent, or Firm* — Womble Bond Dickinson (US) LLP

(57) ABSTRACT

An injection locked frequency divider includes a mixer circuit and a filter circuit. The mixer circuit includes two mixer units and two inductors. The mixer units mix a differential input voltage signal with a reference signal to output a differential current signal. The inductors cooperatively receive the differential current signal from the mixer units. The filter circuit is connected to the inductors, and filters the differential current signal to output a filtered differential voltage signal.

12 Claims, 4 Drawing Sheets

INJECTION LOCKED FREQUENCY DIVIDER

CROSS-REFERENCE TO RELATED APPLICATION

This application claims priority to Taiwanese Patent Application No. 107114831 filed on May 2, 2018.

FIELD

The disclosure relates to an injection locked frequency divider, and more particularly to a divide-by-three injection locked frequency divider.

BACKGROUND

In a wireless communication system, a divide-by-three injection locked frequency divider (ILFD) is employed to perform frequency division on a differential input voltage signal (e.g., at 78 GHz) to generate a differential output voltage signal having a frequency (e.g., 26 GHz) that is one-third the frequency of the differential input voltage signal.

Referring to FIG. 1, a conventional divide-by-three ILFD includes a mixer circuit 11, a filter circuit 12 that is a voltage-controlled oscillator having an oscillator frequency, and first and second buffer circuits 13, 14. The mixer circuit 11 includes two transistors 111, 112, receives a differential input voltage signal, and then mixes the differential input voltage signal and a voltage at the drains of the transistors 111, 112 which has a frequency about twice the oscillator frequency, so as to output a differential mixed signal. The filter circuit 12 filters the differential mixed signal to output a filtered differential voltage signal that has a frequency being one-third of the frequency of the differential input voltage signal. The first and second buffer circuits 13, 14 cooperatively buffer the filtered differential voltage signal so as to generate a differential output voltage signal (vo1, vo2).

A frequency locking range of the conventional divide-by-three ILFD, which is a frequency range for the conventional divide-by-three ILFD to correctly perform the frequency division by three, is somewhat narrow, ranging from 77 GHz to 79 GHz in this example. When the injection locking range of the conventional divide-by-three ILFD deviates to a range of, for example, from 74 GHz to 76 GHz because of variation in manufacturing process or temperature, the conventional divide-by-three ILFD may fail to perform correct frequency division by three on a differential input voltage signal having a frequency of, for example, 78 GHz, which now falls outside of the frequency locking range.

SUMMARY

Therefore, an object of the disclosure is to provide an injection locked frequency divider (ILFD) that has a relatively large locking frequency in comparison with the prior art.

According to the disclosure, an ILFD is provided to include a mixer circuit and a filter circuit. The mixer circuit includes a first mixer unit, a second mixer unit, a first inductor, and a second inductor. The first mixer unit is configured to receive a first input voltage signal having an input frequency and to mix the first input voltage signal and a reference signal so as to output a first current signal that has a phase correlated with a phase of the first input voltage signal. The second mixer unit is configured to receive a second input voltage signal that cooperates with the first input voltage signal to form a differential signal pair, and to mix the second input voltage signal and the reference signal so as to output a second current signal that is complementary to the first current signal in magnitude and that has a phase correlated with a phase of the second input voltage signal. The first inductor has a first terminal electrically connected to the first mixer unit for receiving the first current signal, and a second terminal. The second inductor has a first terminal electrically connected to the second mixer unit for receiving the second current signal, and a second terminal. The filter circuit is electrically connected to the second terminals of the first inductor and the second inductor for respectively receiving the first current signal and the second current signal that respectively flow through the first inductor and the second inductor, and is configured to filter the first current signal and the second current signal to output a filtered differential voltage signal having an output frequency that is one-$N^{th}$ the input frequency, where N is a positive integer not smaller than two.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
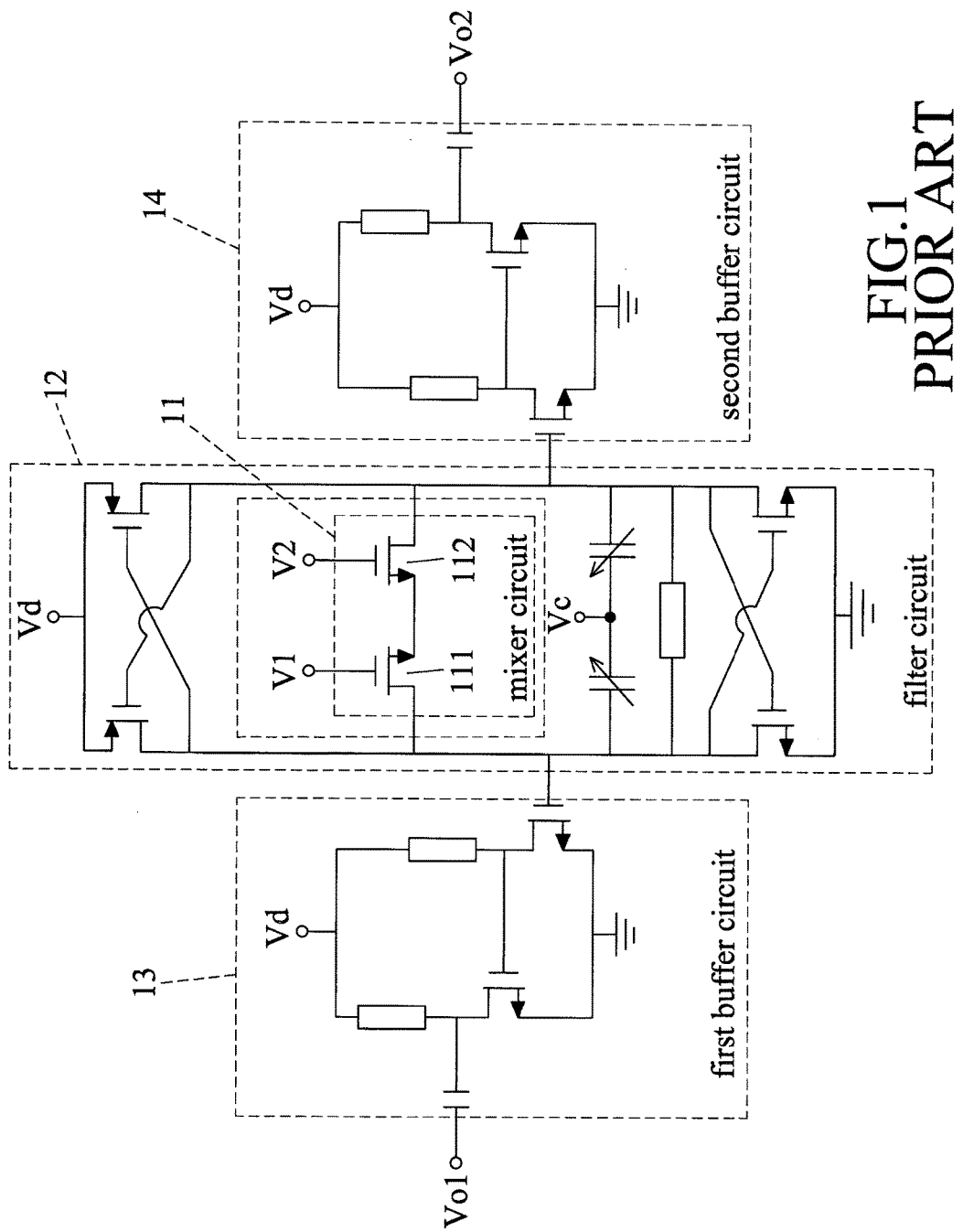
FIG. 1 is a circuit diagram of a conventional injection locked frequency divider (ILFD)

Before the disclosure is described in greater detail, it should be noted that like elements are denoted by the same reference numerals throughout the disclosure.

Figure 2:
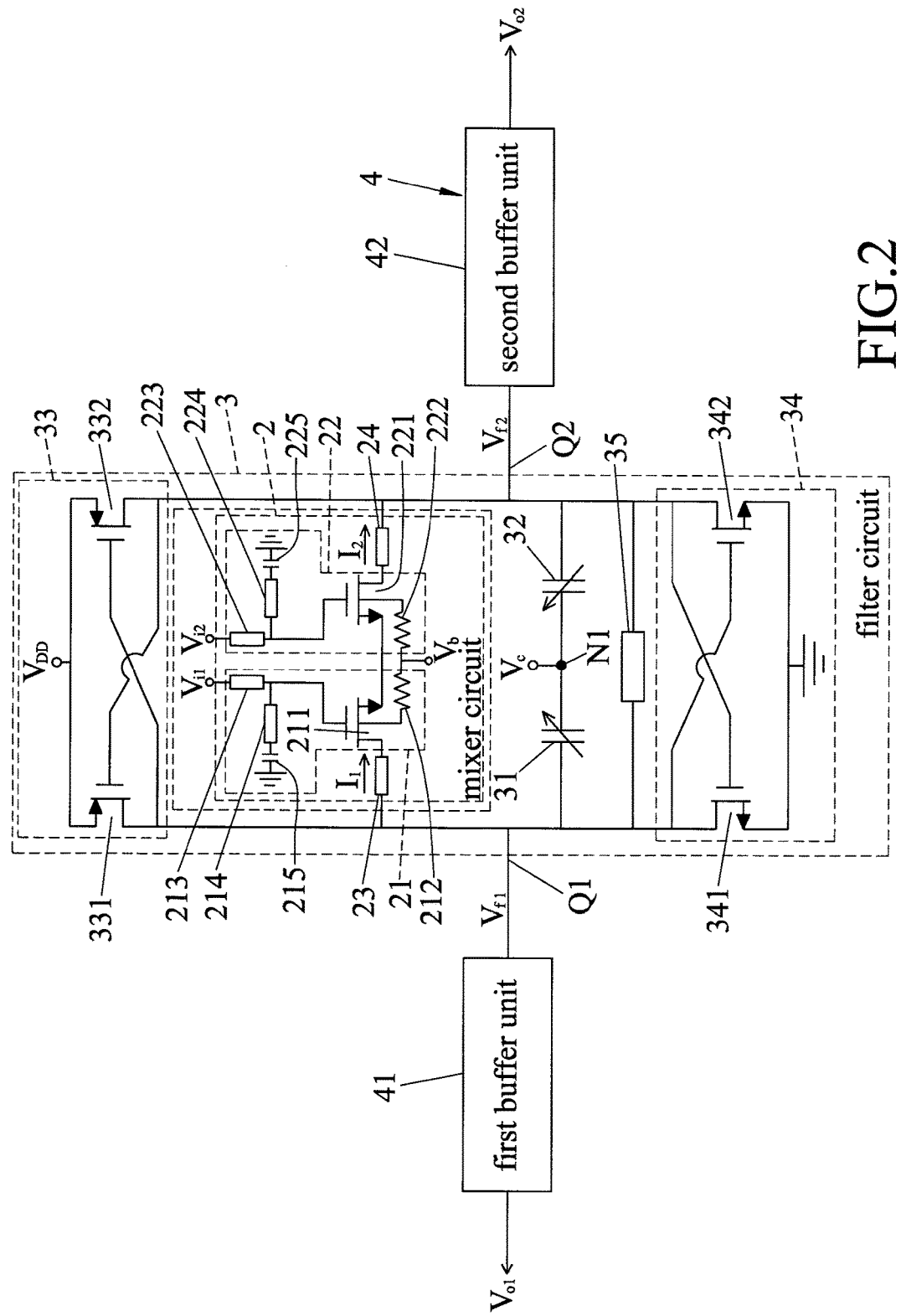
FIGS. 2 and 3 are circuit diagrams of an ILFD according to an embodiment of the present disclosure.
Figure 3:
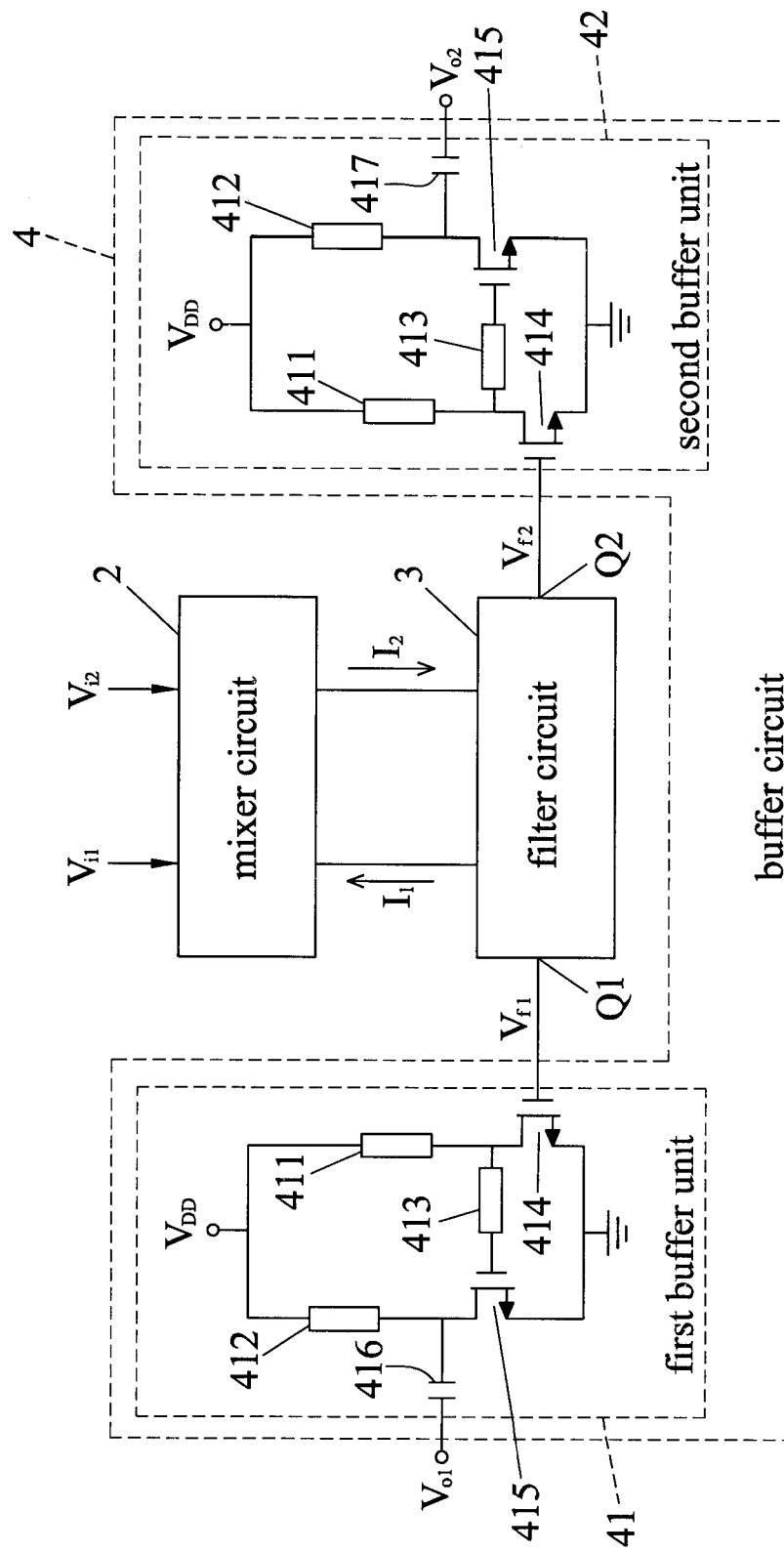

Referring to FIGS. 2 and 3, an injection locked frequency divider (ILFD) according to one embodiment of the present disclosure includes a mixer circuit 2, a filter circuit 3 and a buffer circuit 4.

The mixer circuit 2 includes first and second mixer units 21, 22 and first and second inductors 23, 24. The first mixer unit 21 is configured to receive a first input voltage signal ($V_{i1}$) having an input frequency and to mix the first input voltage signal ($V_{i1}$) and a reference signal so as to output a first current signal ($I_1$) that has a phase correlated with a phase of the first input voltage signal ($V_{i1}$). In this embodiment, the first mixer unit 21 includes a transistor 211, a resistor 212, two inductors 213, 214, and a capacitor 215.

The transistor 211 has a first terminal which provides the first current signal ($I_1$), a second terminal at which a voltage serves as the reference signal, a control terminal which is for receiving the first input voltage signal ($V_{i1}$), and a body terminal. The resistor 212 has a first terminal that is electrically connected to the body terminal of the transistor 211, and a second terminal that is for receiving a biasing voltage ($V_b$). The inductor 213 has a first terminal for receiving the first input voltage signal ($V_{i1}$), and a second terminal electrically connected to the control terminal of the transistor 211. The inductor 214 is electrically connected to the second terminal of the inductor 213. The capacitor 215 is connected to ground, and is connected in series with the inductor 214 between the second terminal of the inductor 213 and ground.

The second mixer unit 22 is electrically connected to the second terminal of the transistor 211 of the first mixer unit 21, and is configured to receive a second input voltage signal ($V_{i2}$) that cooperates with the first input voltage signal ($V_{i1}$) to form a differential signal pair, and to mix the second input voltage signal ($V_{i2}$) and the reference signal so as to output a second current signal ($I_2$) that is complementary to the first current signal ($I_1$) in magnitude and that has a phase correlated with a phase of the second input voltage signal ($V_{i2}$). In this embodiment, the second mixer unit 22 includes a transistor 221, a resistor 222, two inductors 223, 224 and a capacitor 225.

The transistor 221 has a first terminal which provides the second current signal ($I_2$), a second terminal which is electrically connected to the second terminal of the transistor 211 of the first mixer unit 21, a control terminal which is for receiving the second input voltage signal ($V_{i2}$), and a body terminal. The resistor 222 has a first terminal electrically connected to the body terminal of the transistor 221, and a second terminal for receiving the biasing voltage ($V_b$). The inductor 223 has a first terminal for receiving the second input voltage signal ($V_{i2}$), and a second terminal electrically connected to the control terminal of the transistor 221. The inductor 224 is electrically connected to the second terminal of the inductor 223. The capacitor 225 is connected to ground, and is connected in series with the inductor 224 between the second terminal of the inductor 223 and ground.

The first inductor 23 has a first terminal electrically connected to the first terminal of the transistor 211 of the first mixer unit 21 for receiving the first current signal ($I_1$), and a second terminal.

The second inductor 24 has a first terminal electrically connected to the first terminal of the transistor 221 of the second mixer unit 22 for receiving the second current signal ($I_2$), and a second terminal.

The filter circuit 3 is electrically connected to the second terminals of the first and second inductors 23, 24 for respectively receiving the first current signal ($I_1$) and the second current signal ($I_2$) that respectively flow through the first and second inductors 23, 24. The filter circuit 3 is configured to filter the first current signal ($I_1$) and the second current signal ($I_2$) to output a filtered differential voltage signal including a filtered first voltage signal ($V_{f1}$) and a filtered second voltage signal ($V_{f2}$) that is complementary to the filtered first voltage signal ($V_{f1}$) in magnitude. The filtered differential voltage signal has an output frequency that is one-$N^{th}$ the input frequency of the first input voltage signal ($V_{i1}$), where N is positive a integer not smaller than two. The filter circuit 3 includes a first output node (Q1), a second output node (Q2), two variable capacitors 31, 32, a first negative resistance compensation unit 33, a second negative resistance compensation unit 34 and an inductor 35. In this embodiment, the filter circuit 3 is a voltage-controlled oscillator (VCO) that works as a band-pass filter but the present disclosure is not limited in this respect.

The first output node (Q1) and the second output node (Q2) at which the filtered first voltage signal ($V_{f1}$) and the filtered second voltage signal ($V_{f2}$) are respectively outputted are electrically and respectively connected to the second terminals of the first and second inductors 23, 24. The variable capacitors 31, 32 are connected in series between the first output node (Q1) and the second output node (Q2), and have a common node (N1) at which an adjusting voltage ($V_c$) is provided. Each of the variable capacitors 31, 32 has a capacitance in relation to the adjusting voltage ($V_c$).

The first negative resistance compensation unit 33 includes two transistors 331, 332, each of which has a first terminal, a second terminal and a control terminal. The first terminals of the transistors 331, 332 are electrically connected to each other and are for receiving a power supply voltage ($V_{DD}$). The second terminals of the transistors 331, 332 are respectively and electrically connected to the first output node (Q1) and the second output node (Q2). The control terminal of the transistor 331 is electrically connected to the second terminal of the transistor 332, and the control terminal of the transistor 332 is electrically connected to the second terminal of the transistor 331.

The second negative resistance compensation unit 34 includes two transistors 341, 342, each of which has a first terminal, a second terminal and a control terminal. The first terminals of the transistors 341, 342 are respectively and electrically connected to the first output node (Q1) and the second output node (Q2). The second terminals of the transistors 341, 342 are connected to ground. The control terminal of the transistor 341 is electrically connected to the first terminal of the transistor 342, and the control terminal of the transistor 342 is electrically connected to the first terminal of the transistor 341.

The inductor 35 is electrically connected between the first output node (Q1) and the second output node (Q2), and is configured to cooperate with the variable capacitors 31, 32 and parasitic capacitances of the transistors 331, 332, 341, 342 that are connected in parallel to the inductor 35 to form an LC resonant circuit that reaches resonance at the output frequency (i.e. the resonant frequency of the LC resonant circuit is the output frequency).

The output frequency may be calculated according to:

$$fo = \frac{1}{2\pi\sqrt{L_{35} \cdot (C_f + C_v)}} \quad (1)$$

where fo is the output frequency, $L_{35}$ is half of an inductance of the inductor 35, $C_f$ is a total capacitance of the parasitic capacitances of the transistors 331, 332, 341, 342 at the first output node (Q1) seen into the first buffer unit 41 and the first mixer unit 21, or at the second output node (Q2) seen into the second buffer unit 42 and the second mixer unit 22, $C_v$ is a capacitance of the variable capacitor 31 (or the variable capacitor 32). When the ILFD of this embodiment is intended to be a divide-by-N ILFD, the capacitances of the variable capacitors 31, 32 and the inductance of the inductor 35 can be configured in consideration of the parasitic capacitances of the transistors 331, 332, 341, 342 to cause the resonant frequency to be about one-$N^{th}$ the expected input frequency of the first and second input voltage signals ($V_{i1},V_{i2}$) based on Equation (1). Hereinafter, the ILFD of this embodiment is exemplified to be a divide-by-three ILFD, which means that the capacitances of the variable capacitors 31, 32 and the inductance of the inductor 35 can be configured in consideration of the parasitic capacitances of the transistors 331, 332, 341, 342 to cause the resonant frequency to be about one-third the expected input frequency of the first and second input voltage signals ($V_{i1},V_{i2}$) based on Equation (1).

In this embodiment, $C_f$ is a fixed value, and the capacitance of each of the capacitors 31, 32 is adjustable by modifying the adjusting voltage ($V_c$), so as to change the output frequency (fo). It should be noted that, the first negative resistance compensation unit 33 and the second negative resistance compensation unit 34 provide equivalent negative resistances for compensating power loss resulting from parasitic resistance of the LC resonant circuit which consists of the variable capacitors 31, 32 and the inductor 35.

As shown in FIG. 3, the buffer circuit 4 is electrically connected to the filter circuit 3 for receiving the filtered differential voltage signal, i.e., the filtered first voltage signal ($V_{f1}$) and the filtered second voltage signal ($V_{f2}$), and is configured to buffer the filtered differential voltage signal so as to generate a differential output voltage signal that includes a first output voltage signal ($V_{o1}$) and a second output voltage signal ($V_{o2}$) complementary to the first output voltage signal ($V_{o1}$) in magnitude. In this embodiment, the buffer circuit 4 includes two buffer units 41, 42 for buffering the filtered first voltage signal ($V_{f1}$) and the filtered second voltage signal ($V_{f2}$), respectively.

Each of the buffer units 41, 42 includes three inductor 411, 412, 413, two transistor 414, 415, and a capacitor 416.

For each of the buffer units 41, 42, the inductor 411 has a first terminal for receiving a power supply voltage ($V_{DD}$), and a second terminal; the transistor 414 has a first terminal electrically connected to the second terminal of the inductor 411, a grounded second terminal, and a control terminal coupled to the filter circuit 3 for receiving a respective one of the filtered first and second voltage signals ($V_{f1}, V_{f2}$); the inductor 412 has a first terminal electrically connected to the first terminal of the inductor 411, and a second terminal; the transistor 415 has a first terminal electrically connected to the second terminal of the inductor 412, a second terminal connected to ground, and a control terminal; the inductor 413 is electrically connected between the first terminal of the transistor 414 and the control terminal of the transistor 415; the capacitor 416 has a first terminal electrically connected to the first terminal of the transistor 415, and a second terminal providing a respective one of the first and second output voltage signals ($V_{o1}$, $V_{o2}$).

It should be noted that each of the transistors 211, 221, 341, 342, 414, 415 is, for example, an N-type metal-oxide-semiconductor field-effect transistor (MOSFET) that has a drain terminal serving as the first terminal thereof, a source terminal serving as the second terminal thereof, and a gate terminal serving as the control terminal thereof; each of the transistors 331, 332 is, for example, a P-type MOSFET that has a source terminal serving as the first terminal thereof, a drain terminal serving as the second terminal thereof, and a gate terminal serving as the control terminal thereof; each of the inductors 23, 24, 35, 213, 214, 223, 224, 411-413 is, for example, a transmission line; and the present disclosure is not limited in this respect.

Since the filter circuit 3 is a VCO in this embodiment, the filter circuit 3 may generate an oscillating signal at the resonant frequency (free-running frequency) thereof even if the first input voltage signal ($V_{i1}$) and the second input voltage signal ($V_{i2}$) are not provided to the first and second mixer units 21, 22, and the first and second mixer units 21, 22 may be seen as a load of the transistors 331, 332, 341, 342. Because of the non-linear characteristics of the transistors 331, 341, 332, 342 that cause the output thereof to have harmonic components, the first and second mixer units 21, 22 that are connected in symmetry have a voltage signal (i.e., the reference signal) at the frequency which is twice the output frequency at the common node of the transistors 211, 221 (i.e., the second terminals of the transistors 211, 221).

After the differential input voltage signal ($V_{i1}$, $V_{i2}$) having the input frequency of 3fo is provided to the mixer circuit 2, the differential current signal pair ($I_1$, $I_2$) generated by the mixer circuit 2 mixing the differential input voltage signal pair ($V_{i1}$, $V_{i2}$) and the reference signal that has the frequency of 2fo may have a high frequency current signal component at a frequency of 5fo and a low frequency current signal component at a frequency of fo. The filter circuit 3 filters out the high frequency current signal component to output the filtered differential voltage signal.

In this embodiment, a width of the frequency locking range of the ILFD is obtained by Equation (2) shown below:

$$LR = \frac{3fo}{Q} \cdot \frac{I_i}{\sqrt{I_o^2 - I_i^2}} \qquad (2)$$

$$I_i = \frac{I_n}{1 - \omega^2 \cdot L_i \cdot C_p} \qquad (3)$$

where LR represents the width of the frequency lock range of the ILFD of this embodiment, fo represents the resonant frequency (output frequency) (see Equation (1)), the number "3" comes from the exemplification of the ILFD as a divide-by-three ILFD, Q is a quality factor of the ILFD, $I_o$ is a drain current of each of the transistors 331, 332, 341, 342 (they are expected to have the same drain current), $I_i$ is a drain current of each of the transistors 211, 221 (they are expected to have the same drain current), $I_n$ is a drain current of the transistor 211 or the transistor 221 in a case that the mixer unit 2 excludes the inductors 23, 24, ω is the output frequency represented in a form of angular frequency, $L_i$ is an inductance of the inductor 23 or the inductor 24, and $C_p$ is a parasitic capacitance of the transistor 211 or the transistor 221.

According to Equation (2), a greater drain current ($I_i$) of each of the transistors 211, 221 may lead to a wider frequency locking range (LR) of the ILFD. According to Equation (3), the drain current ($I_i$) of each of the transistors 211, 221 of the mixer circuit 2 including the inductors 23, 24 is greater than the drain current ($I_n$) of each of the transistors 211, 221 when the mixer circuit 2 excludes the inductors 23, 24. In other words, the inductors 23, 24 lead to increase of the drain currents of the transistors 211, 221. As a result, the frequency locking range (LR) of the ILFD of the present disclosure is wider than that of the conventional ILFD (see FIG. 1), i.e., $$lr \approx \frac{3fo}{Q} \cdot \frac{I_n}{\sqrt{I_o^2 \cdot I_n^2}}, I_n < I_i,$$

where lr represents a width of the frequency locking range of the conventional ILFD.

Additionally, the biasing voltage ($V_b$) is provided to make the voltage at the body of the transistors 211, 221 greater than the voltage at the source terminal of the respective transistors 211, 221 by a voltage of, for example, between 0.02 V and 0.2 V, so as to reduce a threshold voltage of each transistor 211, 221, thereby increasing the drain currents of the respective transistors 211, 221 and making the frequency locking range wider. Moreover, according to Equation (2), when the output frequency (fo) is increased, the width of the frequency locking range is increased. According to Equation (1), when the capacitance ($C_v$) of each of the variable capacitors 31, 32 is decreased by changing the adjusting voltage ($V_c$), the resonant frequency (fo) is increased and the width of the frequency locking range is increased also.

Figure 4:
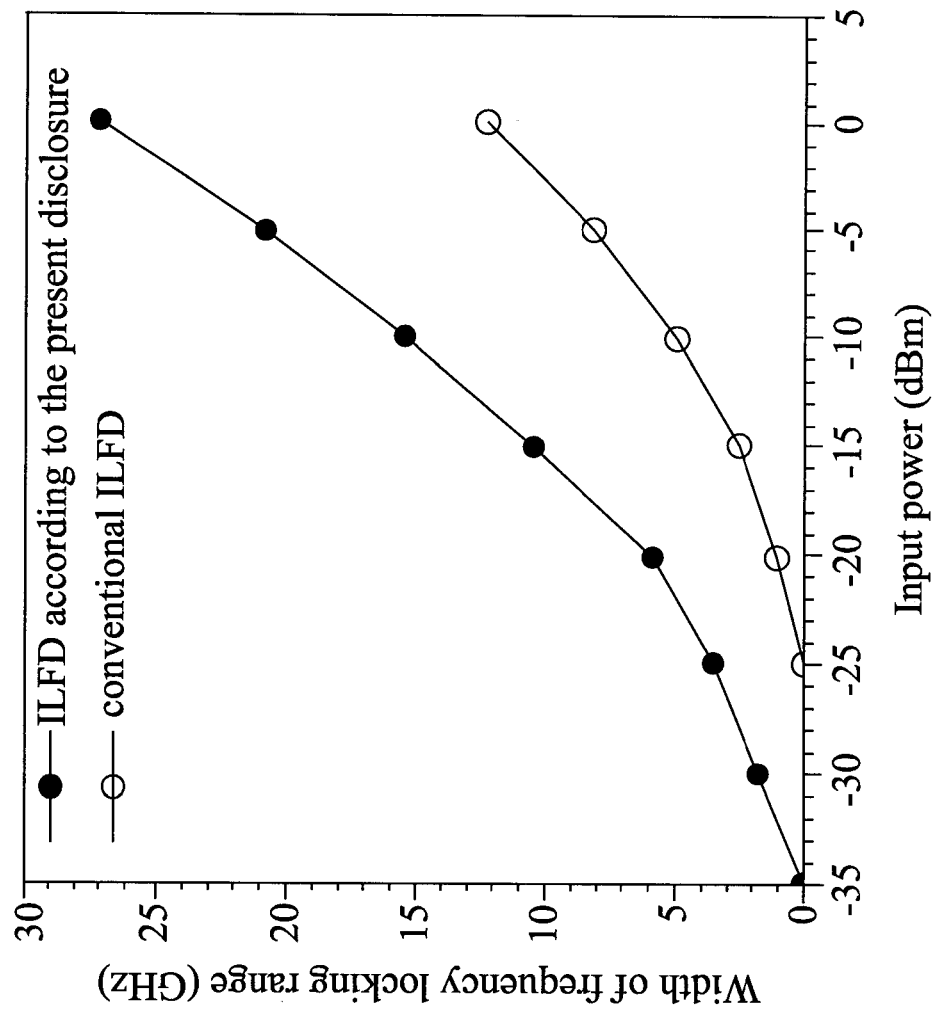
FIG. 4 is a simulation plot illustrating relationships between width of frequency locking range and input power for the ILFD of the embodiment and the conventional ILFD.

Referring to FIG. 4, when a differential input voltage signal has a frequency of 78 GHz, a plot is shown to illustrate relationships between width of frequency locking range and input power for the ILFD of the embodiment and the conventional ILFD (see FIG. 1), where the input power refers to power of the signal inputted to the ILFD, such as the differential input voltage signal pair ($V_{i1}$, $V_{i2}$) in this embodiment. In this embodiment, the width of the frequency locking range of the ILFD is defined as the width of the frequency locking range corresponding to input power of 0 dBm. As shown in FIG. 4, for the differential input voltage signal pair having input power of 0 dBm, the frequency locking range of the ILFD of the present disclosure has a width of 27 GHz and the frequency locking range of the conventional ILFD has a width of 12.1 GHz. In other words, the frequency locking range of the ILFD of the present disclosure is wider than that of the conventional ILFD. Additionally, a sensitivity of the ILFD is correlated to minimum input power required for the ILFD to normally perform the frequency division (i.e., frequency division by three in this embodiment). The smaller minimum input power level required for an ILFD means the better sensitivity of the ILFD. As can be seen in FIG. 4, the minimum input power required for the ILFD of the present disclosure is −35 dBm, whereas the minimum input power required for the conventional ILFD is −25 dBm. That is to say, the ILFD of the present disclosure has better sensitivity as compared to the conventional ILFD.

In sum, by virtue of the inductors 23, 24 and the voltage at the body terminals of the transistors 211, 221 being greater than the voltage at the drains of the transistors 211, 221, the drain currents ($I_i$) of the transistors 211, 221 (i.e., the first and second current signals ($I_1$, $I_2$)) may be increased, thereby resulting in a wider frequency locking range. Further, by virtue of input impedance matching resulting from the cooperation of the inductors 213, 214 and the capacitor 215, and the cooperation of the inductors 223, 224 and the capacitor 225, input power required for the ILFD to normally perform frequency division may be reduced, achieving relatively good sensitivity.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An injection locked frequency divider (ILFD) comprising:
    a mixer circuit including
        a first mixer unit configured to receive a first input voltage signal having an input frequency and to mix the first input voltage signal and a reference signal so as to output a first current signal that has a phase correlated with a phase of the first input voltage signal,
        a second mixer unit configured to receive a second input voltage signal that cooperates with the first input voltage signal to form a differential signal pair, and to mix the second input voltage signal and the reference signal so as to output a second current signal that is complementary to the first current signal in magnitude and that has a phase correlated with a phase of the second input voltage signal,
        a first inductor having a first terminal electrically connected to said first mixer unit for receiving the first current signal, and a second terminal, and
        a second inductor having a first terminal electrically connected to said second mixer unit for receiving the second current signal, and a second terminal; and
    a filter circuit electrically connected to said second terminals of said first inductor and said second inductor for respectively receiving the first current signal and the second current signal that respectively flow through said first inductor and said second inductor, and configured to filter the first current signal and the second current signal to output a filtered differential voltage signal having an output frequency that is one-$N^{th}$ the input frequency, where N is a positive integer not smaller than two.

2. The ILFD as claimed in claim 1, wherein said first mixer unit includes
    a transistor having a first terminal which is electrically connected to said first terminal of said first inductor and which provides the first current signal, a second terminal which is electrically connected to said second mixer unit and at which a voltage serves as the reference signal, a control terminal which is for receiving the first input voltage signal, and a body terminal, and
    a resistor having a first terminal that is electrically connected to said body terminal of said transistor, and a second terminal that is for receiving a biasing voltage.

3. The ILFD as claimed in claim 2, wherein said first mixer unit further includes
    a third inductor having a first terminal for receiving the first input voltage signal and a second terminal electrically connected to said control terminal of said transistor,
    a fourth inductor electrically connected to said second terminal of said third inductor, and
    a capacitor connected to ground, and connected in series with said fourth inductor between said second terminal of said third inductor and ground.

4. The ILFD as claimed in claim 1, wherein said second mixer unit includes
    a transistor having a first terminal which is electrically connected to said first terminal of said second inductor and which provides the second current signal, a second terminal which is electrically connected to said first mixer unit and at which a voltage serves as the reference signal, a control terminal which is for receiving the second input voltage signal, and a body terminal, and a resistor having a first terminal electrically connected to said body terminal of said transistor, and a second terminal for receiving a biasing voltage.

5. The ILFD as claimed in claim 4, wherein said second mixer unit further includes
   a third inductor having a first terminal for receiving the second input voltage signal, and a second terminal electrically connected to said control terminal of said transistor,
   a fourth inductor electrically connected to said second terminal of said third inductor, and
   a capacitor connected to ground, and connected in series with said fourth inductor between said second terminal of said third inductor and ground.

6. The ILFD as claimed in claim 1, further comprising:
   a buffer circuit electrically connected to said filter circuit for receiving the filtered differential voltage signal and configured to buffer the filtered differential voltage signal so as to generate a differential output voltage signal.

7. The ILFD as claimed in claim 6, the filtered differential voltage signal including a filtered first voltage signal and a filtered second voltage signal that is complementary to the filtered first voltage signal in magnitude, the differential output voltage signal including a first output voltage signal and a second output voltage signal that is complementary to the first output voltage signal in magnitude, wherein said buffer circuit includes a first buffer unit and a second buffer unit, each of said first buffer unit and said second buffer unit including:
   a third inductor having a first terminal for receiving a power supply voltage, and a second terminal;
   a first transistor having a first terminal electrically connected to said second terminal of said third inductor, a second terminal connected to ground, and a control terminal;
   a fourth inductor having a first terminal electrically connected to said first terminal of said third inductor, and a second terminal;
   a second transistor having a first terminal electrically connected to said second terminal of said fourth inductor, a second terminal connected to ground, and a control terminal;
   a fifth inductor electrically connected between said first terminal of said first transistor and said control terminal of said second transistor; and
   a capacitor having a first terminal electrically connected to said first terminal of said second transistor, and a second terminal;
   wherein said control terminal of said first transistor of said first buffer unit receives the filtered first voltage signal, and said second terminal of said capacitor of said first buffer unit provides the first output voltage signal,
   wherein said control terminal of said first transistor of said second buffer unit receives the filtered second voltage signal, and said second terminal of said capacitor of said second buffer unit provides the second output voltage signal.

8. The ILFD as claimed in claim 1, the filtered differential voltage signal including a filtered first voltage signal and a filtered second voltage signal that is complementary to the filtered first voltage signal, wherein said filter circuit includes
   a first output node and a second output node which are electrically and respectively connected to said second terminals of said first and second inductors and at which the filtered first voltage signal and the filtered second voltage signal are respectively outputted,
   two variable capacitors which are connected in series between said first output node and said second output node, and each of which has a capacitance in relation to an adjusting voltage to be provided to a common node of said variable capacitors,
   a first negative resistance compensation unit and a second negative resistance compensation unit electrically connected to said first output node and said second output node and configured to respectively provide equivalent negative resistances, and
   a third inductor electrically connected between said first output node and said second output node, and configured to cooperate with said variable capacitors and parasitic capacitances of said first negative resistance compensation unit and said second negative resistance compensation unit to form a resonant circuit that reaches resonance at the output frequency.

9. The ILFD as claimed in claim 8, wherein said first negative resistance compensation unit includes a first transistor and a second transistor, each of said first transistor and said second transistor having a first terminal, a second terminal and a control terminal, said first terminals of said first transistor and said second transistor being electrically connected to each other and being for receiving a power supply voltage, said second terminals of said first transistor and said second transistor respectively and electrically connected to said first output node and said second output node, said control terminal of said first transistor electrically connected to said second terminal of said second transistor, said control terminal of said second transistor electrically connected to said second terminal of said first transistor.

10. The ILFD as claimed in claim 8, wherein said second negative resistance compensation unit includes a first transistor and a second transistor, each of said first transistor and said second transistor having a first terminal, a second terminal and a control terminal, said first terminals of said first transistor and said second transistor respectively and electrically connected to said first output node and said second output node, said second terminals of said first transistor and said second transistor connected to ground, said control terminal of said first transistor electrically connected to said first terminal of said second transistor, said control terminal of said second transistor electrically connected to said first terminal of said first transistor.

11. The ILFD as claimed in claim 1, wherein said filter circuit is a voltage-controlled oscillator configured to have a free-running frequency being one-$N^{th}$ the input frequency.

12. The ILFD as claimed in claim 1, wherein N=3; said filter circuit is a voltage-controlled oscillator configured to have a free-running frequency being one-third the input frequency; and the reference signal has a frequency twice the output frequency.

* * * * *